United States Patent
Roy

(10) Patent No.: US 9,401,198 B1
(45) Date of Patent: Jul. 26, 2016

(54) NON-VOLATILE DYNAMIC RANDOM ACCESS MEMORY (NVDRAM)

(71) Applicant: FREESCALE SEMICONDUCTOR, INC., Austin, TX (US)

(72) Inventor: Anirban Roy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/788,285

(22) Filed: Jun. 30, 2015

(51) Int. Cl.
*G11C 5/06* (2006.01)
*G11C 11/4096* (2006.01)
*G11C 11/408* (2006.01)
*G11C 11/16* (2006.01)
*G11C 5/00* (2006.01)

(52) U.S. Cl.
CPC .............. *G11C 11/4096* (2013.01); *G11C 5/00* (2013.01); *G11C 11/1653* (2013.01); *G11C 11/1673* (2013.01); *G11C 11/1675* (2013.01); *G11C 11/4087* (2013.01); *G11C 2207/00* (2013.01)

(58) Field of Classification Search
CPC ........... G11C 11/4096; G11C 11/4087; G11C 11/1653; G11C 5/00; G11C 2207/00
USPC ........... 365/63, 72, 148, 158, 185.05, 185.18, 365/185.15, 185.24
See application file for complete search history.

(56) References Cited

U.S. PATENT DOCUMENTS

| | | | |
|---|---|---|---|
| 6,097,629 A | 8/2000 | Dietrich et al. | |
| 6,556,487 B1 | 4/2003 | Ratnakumar et al. | |
| 7,054,194 B2 | 5/2006 | Liaw et al. | |
| 7,692,954 B2 | 4/2010 | Lamorey | |
| 7,944,734 B2 | 5/2011 | Lamorey | |
| 8,194,438 B2 | 6/2012 | Ahn et al. | |
| 8,508,983 B2 | 8/2013 | Wang et al. | |
| 8,576,628 B2 * | 11/2013 | Ueda .................. | G11C 16/0441 365/185.18 |
| 8,605,490 B2 | 12/2013 | Fackenthal | |
| 9,099,181 B2 | 8/2015 | Ong | |

OTHER PUBLICATIONS

Tanaka et al, "Normally-off type nonvolatile static random access memory with perpendicular spin torque transfer-magnetic random access memory cells and smallest number of transistors", Japanese Journal of Applied Physics 53, 2014, pp. 04EM07-1-04EM07-4.
Abe, Novel Hybrid DRAM/MRAM Design for Reducing Power of High Performance Mobile CPU, IEEE International Electron Devices Meeting, Dec. 10-13, 2012, pp. 10.5.1-10.5.4, San Francisco, CA.
Fukumoto et al, "A 256-K Non-Volatile PSRAM with Page Recall and Chip Store", Symposium on VLSI Circuits, Digest of Technical Papers, May 30-Jun. 1, 1991, pp. 91-92, Oiso, Japan.
U.S. Appl. No. 14/568,467, filed Dec. 12, 2014.

\* cited by examiner

*Primary Examiner* — Gene Auduong

(57) ABSTRACT

A NVDRAM includes a first NV element coupled to a first terminal of a second NV element at a transfer node. A volatile cell has a transfer transistor coupled to the transfer node and has a storage node. A first NV line is coupled to the second terminal of the first NV element. Circuitry applies an alternated signal to the transfer node, couples the second terminal of the second non-volatile element to a second NV line, and applies a program signal across the first and second NV lines during a program mode that establishes a logic state. The circuitry applies a read signal across the first and second NV lines, couples the second terminal of the second NV element to the second NV line, and replaces the alternated signal with floating during a restore mode that loads the logic state into the storage node.

19 Claims, 1 Drawing Sheet

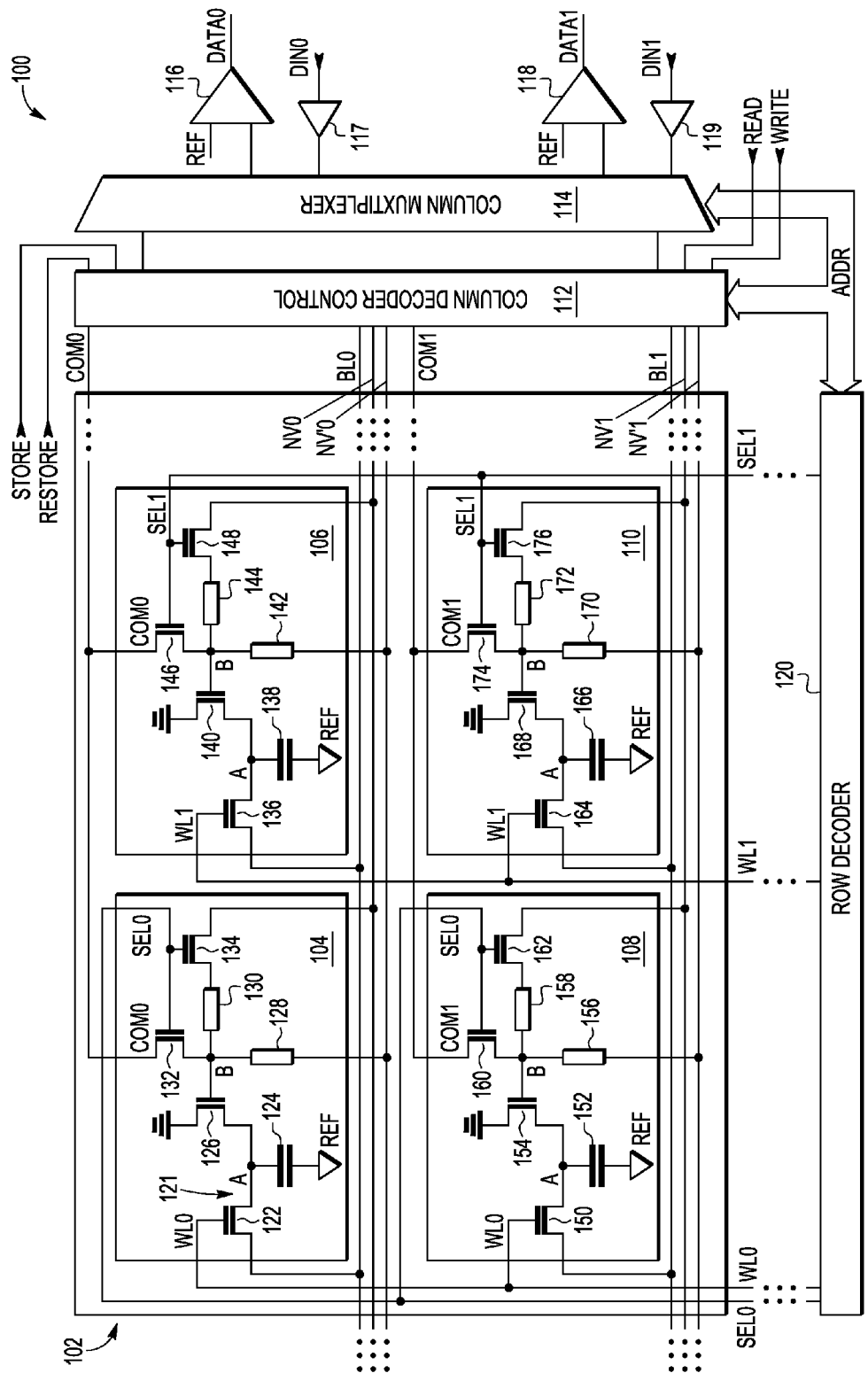

NON-VOLATILE DYNAMIC RANDOM ACCESS MEMORY (NVDRAM)

BACKGROUND

1. Field

This disclosure relates generally to integrated circuits, and more particularly, to non-volatile dynamic random access memories (NVDRAMs).

2. Related Art

Non-volatile memories (NVMs) have become very important in a variety of applications but NVMs typically are slower than other types of memories. Thus it is common to have both NVMs and random access memories (RAMs) on the same integrated circuit because normal operations typically do not require the non-volatile feature. One approach is to combine the non-volatile feature with RAM characteristics. For example, the non-volatile feature is used rarely, such as at power-up and power-down, and the RAM characteristic is used otherwise. The RAM characteristic can be for both interfacing with non-volatile feature for simply a portion of the general purpose RAM. Often the RAM is a static RAM (SRAM), but it can be beneficial for the RAM to be a dynamic RAM (DRAM) due to the smaller size. If general purpose DRAM is going to be present on the integrated circuit anyway, then the use of DRAM cells in combination with NVM cells may be more efficient due to the smaller size than using SRAMs in combination with the NVM cells. Arranging a memory that has both the DRAM characteristic and the NVM characteristic in a manner that is effective in reliably achieving the desired operating characteristics without requiring excessive space has been found to be challenging.

Accordingly there is a need to provide further improvement in obtaining NVDRAMs.

BRIEF DESCRIPTION OF THE DRAWINGS

The present invention is illustrated by way of example and is not limited by the accompanying FIGURES, in which like references indicate similar elements. Elements in the FIGURES are illustrated for simplicity and clarity and have not necessarily been drawn to scale.

The FIGURE is a circuit diagram of a non-volatile dynamic random access memory (NVDRAM) memory array.

DETAILED DESCRIPTION

In one aspect, a non-volatile dynamic random access memory cell has a capacitor coupled to a storage node located between two transistors. One of the transistors is coupled to a volatile bit line and the other transistor is coupled to a transfer node located between two non-volatile elements that are coupled together at the transfer node. The two non-volatile elements are selectively programmed to opposite resistive states by coupling the transfer node to a selected voltage while coupling the other terminals of the non-volatile elements to a different selected voltage. The resulting opposing resistive states define a logic state at the transfer node that, when it is desired to read the logic state, is coupled to the storage node where it is selectively coupled to the volatile bit line. This is better understood by reference to the drawings and the following written description.

Shown in the FIGURE is non-volatile dynamic random access memory (NVDRAM) 100 having an array 102 having NVDRAM cells 104, 106, 108, and 110; a column decoder control 112; a column multiplexer 114; an output circuit 116; an input circuit 117, an output circuit 118, an input circuit 119; a row decoder 120; a bit line BL0, a non-volatile line NV0, a non-volatile line NV'0, a bit line BL1, a non-volatile line NV1, a non-volatile line NV'1, a word line WL0, a word line WL1, a select line SEL0, a select line SEL1, a line COM0, and a line COM1. NVDRAM cell 104 comprises a transistor 122, a capacitor 124, a transistor 126, a non-volatile element 128, a non-volatile element 130, a transistor 132, and a transistor 134. Non-volatile elements 128 and 130 may be magnetoresistive tunnel junctions (MTJ) which is the non-volatile element commonly used in MRAMs. NVDRAM cells 106, 108, and 110 have the same elements that are connected the same as NVDRAM 104 except for being connected to a unique combination of word lines, select lines, non-volatile lines, and bit lines. NVDRAM cells 106, 108, and 110 comprise a transistor 136, 150, and 164, respectively; a capacitor 138, 152, and 166, respectively; a transistor 140, 154, 168, respectively; a non-volatile element 142, 156, and 170, respectively; a non-volatile element 144, 158, and 172, respectively; a transistor 146, 160, and 174, respectively, and a transistor 148, 162, and 176, respectively.

Using NVDRAM 104 as the example for NVDRAMs 106, 108, and 110, as well as many other NVDRAMs not shown, transistor 122, which may be N channel, has a first current electrode connected to bit line BL0, a control electrode coupled to word line WL0, and a second current electrode coupled to a node A. Capacitor 124 has a first terminal connected to node A and a second terminal connected to a reference voltage Vref, which may be ground. Capacitor 124 and transistor 122 together form a DRAM cell 121. Transistor 126, which may be N channel, has a first current electrode which is the source in this case, connected to ground, a second current electrode coupled to node A, and a gate connected to a node B. Non-volatile element 128 has a first terminal connected to node B and a second terminal connected to line NV'0. Non-volatile element 128 is formed in a direction in which it is written to a higher resistance when current flows from node B to line NV'0 and to a lower resistance when current flows from line NV'0 to node B. Non-volatile element 130 has a first terminal connected to node B and a second terminal connected to transistor 134. Non-volatile element 130 is formed in a direction in which it is written to a higher resistance when current flows from node B to line NV0 and to a lower resistance when current flows from line NV0 to node B. Transistor 134, which may be N channel, has a first current electrode connected to the second terminal of non-volatile element 130, a gate connected to select line SEL0 and to the gate of transistor 132, and a second current electrode connected to line NV0. Transistor 132, which may be N channel, has a first current electrode connected to node B, a gate connected to select line SEL0, and a second current electrode connected to line COM0.

The gates of transistors 136, 150, and 164, which are analogous to transistor 122, are connected to word lines, WL1, WL0, and WL1, respectively. The gates of transistors 146, 160, and 174, which are analogous to transistor 132, are connected to line SEL1, line SEL0, and line SEL1, respectively. The gates of transistors 148, 162, and 176, which are analogous to transistor 134, are connected to line SEL1, line SEL0, and line SEL1, respectively. The second current electrodes of transistors 146, 160, and 174 are connected to line COM0, COM1, and COM1, respectively. The second current electrodes of transistors 148, 162, and 176 are connected to line NV0, line NV1, and line NV1, respectively. The second terminals of non-volatile elements 142, 156, and 170, which are analogous to non-volatile element 128, are connected to line NV'0, line NV'1, and line NV'1, respectively.

Operation of NVDRAM cells 104, 106, 108, and 110 includes reading, writing, store, and restore. Using NVDRAM as an example, reading, in response to column decoder control 112 receiving a read signal, is achieved by row decoder 120 asserting a logic high on word line WL0, selected by the row portion of the address, which causes transistor 122 to become conductive which couples node A to bit line BL0 so that the logic state of node A is thereby coupled to bit line BL0. Column decoder control 112 couples bit line BL0 as selected by a portion of the column address to column multiplexer 114. Column multiplexer 114 then couples bit line BL0 to output circuit 116, as selected by another portion of the column address, which compares the signal present on bit line BL0 to a reference REF and provides a logic high output as output signal DATA0 if bit line BL0 is a logic high and a logic low if bit line BL0 is a logic low. Column decoder control 112 and column multiplexer 114 may provide sensing and buffering of the signal present on bit line BL0 prior to amplifier 116 receiving it. Writing into NVDRAM cell is achieved by writing into node A of DRAM cell 121 by reversing the process of reading. An input signal DIN0 is received by input circuit 117 where it is routed to bit line BL0 by column multiplexer 114 and column decoder control 112 as selected by the column portions of the address. Word line WL0 is asserted with a logic that causes transistor 122 to be conductive which results in bit line 0 being coupled to node A so that logic state present on bit line BL0 becomes present on node A of NVDRAM cell 104. During normal read and write operations, line COM0 is floating, line SEL1 is a logic low so that transistors 132 and 134 are non-conductive, lines NV0 and NV'0 are both at a logic low ensuring that current does not pass through non-volatile elements 128 and 130. With line NV'0 at a logic low and transistors 132 and 134 being non-conductive, node B is held at a logic low. Node B at a logic low ensures that transistor 126 is non-conductive.

For a store operation in the logic state of DRAM 121 is to be stored in non-volatile elements 128 and 130, DRAM cell 121 is read as previously described but word line WL0 is not subsequently asserted during the store operation so that the gate of transistor 122 receives a logic low and is non-conductive and node A is decoupled from bit line BL0. Also, the another logic state from that present in DRAM cell 121 may be what is to be stored. For writing a logic low, line NV0 is at a logic high as applied by column decoder control 112, line NV'0 is at a logic low as applied by column decoder control 112, and line SEL0 is at a logic high as applied by column decoder control 112. For the programming to occur, line COM0 is initially at an intermediate voltage between a logic low and a logic high or at a high impedance, state and then switches between one logic state then the other which can be either logic low followed by logic high or logic high followed by logic low. When a logic high is applied, the logic high is coupled through transistor 132 to node B. With a logic high on node B and a logic low on line NV'0, current flows in the direction through non-volatile element 128 that causes it to be in the relatively high resistance state. No current is flowing through non-volatile element 130 because both line NV0 and node B are at a logic high. When line COM0 switches to the logic low state, node B becomes a logic low, so that current flows from line NV0 through transistor 134 and non-volatile element 130 to node B causing non-volatile element 144 to be in the relatively low resistance state. Line COM0 is then switched back to either the high impedance state or the intermediate state. Thus the logic low is achieved with two non-volatile elements in opposing resistive states to obtain a greater variation with voltage division than using only one non-volatile element in combination with a fixed resistive element.

For storing a logic low, either the timing of the logic high and logic low is reversed for line COM0 or with lines NV0 and NV'0 from that used for storing the logic high. In the case of keeping the timing of line COM0 the same, line NV'0 is initially a logic high and line NV0 is a logic low. When line COM0 is applied at a logic high, node B is a logic high, and current flows from node B to line NV0 causing non-volatile element 130 to become relatively high resistance. With line NV'0 and node B at a logic low, no current flows through non-volatile element 128./ Line COM0 then switches to a logic low causing current to flow from line NV'0 to node B which causes non-volatile element 128 to be in its relatively low resistance state. No current flows through non-volatile element 130 because node B and line NV0 are at a logic low. As for the logic low case, the logic high is achieved with one non-volatile element at its relatively low resistive state while the other is at its relatively high resistive state which also provides for a favorable voltage division as compared to having only one non-volatile element with a fixed resistive element.

For a restore operation in which the logic state established by the non-volatile elements, is coupled to DRAM cell 121, DRAM cell 121 is written to a logic high, and then transistor 122 is kept non-conductive. Line COM0 is kept floating by no signal being applied by column decoder control 112, line SEL0 is applied at a logic high causing transistors 132 and 134 to be conductive, line NV0 is applied at a restore voltage, and line NV'0 is applied at a logic low. For the case of non-volatile elements being at a logic low, non-volatile elements 128 and 130 are at the relatively high resistance and relatively low resistance respectively. The conversion of node A from the logic high initial condition to the logic low condition is achieved by the voltage at node B being sufficient to ensure that transistor 126 becomes sufficiently conductive to convert node A from a logic high to a logic low. For the logic high case of non-volatile elements 128 and 130 being relatively low resistance and relatively high resistance, respectively, transistor 126 is kept non-conductive so as not to disturb the logic high present on node A. The magnitude chosen for the restore voltage is optimized to achieve this desired result of transistor 126 successfully converting node A to a logic low when for the logic low restore and keeping transistor 126 sufficiently non-conductive to keep node A at the logic high sufficiently long so as to be subsequently successfully refreshed.

Thus it is seen that even with relatively small differences between a relatively high resistance and a relatively low resistance, using two non-volatile elements can be effective in obtaining a more robust logic high and logic low.

By now it should be appreciated that there has been disclosed a non-volatile dynamic random access memory (NVDRAM), including a first bit line; a first non-volatile line; a second non-volatile line; a first select line; and a first NVDRAM cell. The first NVDRAM includes a first DRAM cell, coupled to the first bit line. The first DRAM includes a first capacitor having a first terminal coupled to a first storage node and a second terminal coupled to a reference and a first transfer transistor having a first current electrode coupled to a first power supply terminal, a second current electrode coupled to the first storage node, and a control electrode. The first NVDRAM further includes a first pass gate transistor coupled between the first bit line and the first storage node. The first NVDRAM further includes a first non-volatile element having a first terminal coupled to the control electrode of the first transfer transistor and a second terminal coupled to the first non-volatile line. The first NVDRAM further includes a second non-volatile element having a first terminal coupled to the control electrode of the first transfer transistor and a second terminal. The first NVDRAM further includes a first switching transistor having a first current electrode for receiving a first program signal, a second current electrode coupled to the control electrode of the first transfer transistor, and a control electrode coupled to the first select line. The first NVDRAM further includes a second switching transistor having a first current electrode coupled to the second terminal of the second non-volatile element, a second current electrode coupled to the second non-volatile line, and a control electrode coupled to the first select line. The NVDRAM may have a further characterization by which the NVDRAM further comprises a first word line, wherein the first pass gate transistor has a control electrode coupled to the first word line. The NVDRAM may have a further characterization by which the first non-volatile element comprises a first programmable resistor. The NVDRAM may have a further characterization by which the first programmable resistor comprises a RRAM resistor. The NVDRAM may have a further characterization by which the programmable resistor comprises a STT-RAM MTJ. The NVDRAM may further include a second bit line, a fourth non-volatile line, and a second NVDRAM cell coupled to the first bit line. The second NVDRAM cell may further include a second DRAM cell. The second DRAM cell may further include a second capacitor having a first terminal coupled to a second storage node and a second terminal coupled to the reference and a second transfer transistor having a first current electrode coupled to the first power supply terminal, a second current electrode coupled to the second storage node, and a control electrode. The second NVDRAM cell may further include a second pass gate transistor coupled between the second bit line and the second storage node. The second NVDRAM cell may further include a fourth non-volatile element having a first terminal coupled to the control electrode of the second transfer transistor and a second terminal. The second NVDRAM cell may further include a fourth switching transistor having a first current electrode coupled to the second terminal of the fourth non-volatile element, a second current electrode coupled to the fourth non-volatile line, and a control electrode coupled to the first select line. The second NVDRAM cell may further include a third switching transistor having a first current electrode for receiving a second program signal, a second current electrode coupled to the control electrode of the second transfer transistor, and a control electrode coupled to the first select line. The second NVDRAM cell may further include a fourth switching transistor having a first current electrode coupled to the second terminal of the fourth non-volatile element, a second current electrode coupled to the fourth non-volatile line, and a control electrode coupled to the first select line. The NVDRAM may have a further characterization by which the NVDRAM further comprises a first word line, wherein the first pass gate transistor has a control electrode coupled to the first word line and the second pass gate transistor has a control electrode coupled to the first word lin. The NVDRAM may further include a second select line, a third NVDRAM cell, and a third DRAM cell in which the third DRAM cell is coupled to the first bit line and includes a third capacitor having a first terminal coupled to a third storage node and a second terminal coupled to the reference and a third transfer transistor having a first current electrode coupled to the first power supply terminal, a second current electrode coupled to the third storage node, and a control electrode. The third NVDRAM may further include a third pass gate transistor coupled between the first bit line and the third storage node. The third NVDRAM may further include a fifth non-volatile element having a first terminal coupled to the control electrode of the third transfer transistor and a second terminal coupled to the first non-volatile line. The third NVDRAM may further include a sixth non-volatile element having a first terminal coupled to the control electrode of the third transfer transistor and a second terminal. The third NVDRAM may further include a third switching transistor having a first current electrode for receiving the first program signal, a second current electrode coupled to the control electrode of the third transfer transistor, and a control electrode coupled to the second select line. The third NVDRAM may further include a fourth switching transistor having a first current electrode coupled to the second terminal of the fourth non-volatile element, a second current electrode coupled to the fourth non-volatile line, and a control electrode coupled to the second select line. The NVDRAM may have a further characterization by which the NVDRAM further comprises a first word line and a second word line, wherein the first pass gate transistor has a control electrode coupled to the first word line, the second pass gate transistor has a control electrode coupled to the first word line, and the third pass gate transistor has a control electrode coupled to the second word line. The NVDRAM may further include a first decoder coupled to the first bit line, the second bit line, the first non-volatile line, the second non-volatile line, the third non-volatile line, and a fourth non-volatile line. The NVDRAM may further include a multiplexer coupled to the first decoder for providing output data. The NVDRAM may further include a row decoder coupled to the first word line, the second word line, the first select line, and the second select line.

Also disclosed is a method of operating a non-volatile dynamic random access memory (NVDRAM) cell having a first non-volatile element having a first terminal coupled to a first terminal of a second non-volatile element at a transfer node, the first and second non-volatile elements having second terminals including programming the first non-volatile element and the second non-volatile element by applying a voltage differential to the second terminals of the first and second non-volatile elements while providing an alternated voltage at the transfer node to result in a logic state represented by a resistance differential between the first non-volatile element and the second non-volatile element. The method further includes transferring the logic state to a storage node through a transfer transistor coupled to the transfer node and the storage node. The method further includes reading the logic state by coupling the storage node to a bit line through a pass gate transistor. The method may have a further characterization by which the programming is further characterized by the voltage differential being applied across a first non-volatile line and a second non-volatile line, the second terminal of the first non-volatile element being coupled to the first non-volatile line, and the second terminal of the second non-volatile element being coupled to the second non-volatile line and the alternated voltage being applied to the to the transfer node in response to a program signal being enabled. The method may have a further characterization by which the transferring is further characterized by applying a restore signal across the first non-volatile line and the second non-volatile line while coupling the second terminal of the second non-volatile element to the second non-volatile line. The method may have a further characterization by which the transferring is further characterized by a control electrode of the transfer transistor being coupled to the transfer node. The method may have a further characterization by which, during the transferring, the alternated voltage applied during the programming is replaced with floating.

Disclosed also is a non-volatile dynamic random access memory (NVDRAM) including a first non-volatile element having a first terminal coupled to a first terminal of a second non-volatile element at a transfer node, the first and second non-volatile elements having second terminals. The NVDRAM further includes a DRAM cell having a transfer transistor and a storage node, wherein the transfer transistor is coupled to the storage node and the transfer node. The NVDRAM further includes a first non-volatile line coupled to the second terminal of the first non-volatile element and a second non-volatile line. The NVDRAM further includes circuitry that, during a program mode, applies an alternated signal to the transfer node, couples the second terminal of the second non-volatile element to the second non-volatile line, and applies a program signal across the first and second non-volatile lines and that, during a restore mode, applies a read signal across the first and second non-volatile lines, couples the second terminal of the second non-volatile element to the second non-volatile line, and replaces the alternated signal with floating, in which a logic state represented the first and second non-volatile elements that have been programmed is loaded from the transfer node to the storage node. The NVDRAM may further include a pass gate coupled between a bit line and the storage node that is used to couple the bit line to the storage node that enables reading the logic state.

Although the invention is described herein with reference to specific embodiments, various modifications and changes can be made without departing from the scope of the present invention as set forth in the claims below. For example, the particular type of non-volatile element can vary from the disclosed type. Accordingly, the specification and FIGURES are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile dynamic random access memory (NVDRAM), comprising:
   a first bit line;
   a first non-volatile line;
   a second non-volatile line;
   a first select line; and
   a first NVDRAM cell, comprising:
      a first DRAM cell, coupled to the first bit line, comprising:
         a first capacitor having a first terminal coupled to a first storage node and a second terminal coupled to a reference; and
         a first transfer transistor having a first current electrode coupled to a first power supply terminal, a second current electrode coupled to the first storage node, and a control electrode;
      a first pass gate transistor coupled between the first bit line and the first storage node;
      a first non-volatile element having a first terminal coupled to the control electrode of the first transfer transistor and a second terminal coupled to the first non-volatile line;
      a second non-volatile element having a first terminal coupled to the control electrode of the first transfer transistor and a second terminal;
      a first switching transistor having a first current electrode for receiving a first program signal, a second current electrode coupled to the control electrode of the first transfer transistor, and a control electrode coupled to the first select line; and
      a second switching transistor having a first current electrode coupled to the second terminal of the second non-volatile element, a second current electrode coupled to the second non-volatile line, and a control electrode coupled to the first select line.

2. The NVDRAM of claim 1, wherein the NVDRAM further comprises a first word line, wherein the first pass gate transistor has a control electrode coupled to the first word line.

3. The NVDRAM of claim 1, wherein the first non-volatile element comprises a first programmable resistor.

4. The NVDRAM of claim 3, wherein the first programmable resistor comprises a RRAM resistor.

5. The NVDRAM of claim 3, wherein the programmable resistor comprises a STT-RAM MTJ.

6. The NVDRAM of claim 1, further comprising:
   a second bit line;
   a third non-volatile line;
   a fourth non-volatile line; and
   a second NVDRAM cell, comprising:
      a second DRAM cell, coupled to the first bit line, comprising:
         a second capacitor having a first terminal coupled to a second storage node and a second terminal coupled to the reference; and
         a second transfer transistor having a first current electrode coupled to the first power supply terminal, a second current electrode coupled to the second storage node, and a control electrode;
      a second pass gate transistor coupled between the second bit line and the second storage node;
      a third non-volatile element having a first terminal coupled to the control electrode of the second transfer transistor and a second terminal coupled to the third non-volatile line;
      a fourth non-volatile element having a first terminal coupled to the control electrode of the second transfer transistor and a second terminal;
      a third switching transistor having a first current electrode for receiving a second program signal, a second current electrode coupled to the control electrode of the second transfer transistor, and a control electrode coupled to the first select line; and
      a fourth switching transistor having a first current electrode coupled to the second terminal of the fourth non-volatile element, a second current electrode coupled to the fourth non-volatile line, and a control electrode coupled to the first select line.

7. The NVDRAM of claim 6, wherein the NVDRAM further comprises a first word line, wherein the first pass gate transistor has a control electrode coupled to the first word line and the second pass gate transistor has a control electrode coupled to the first word line.

8. The NVDRAM of claim 6, further comprising:
a second select line; and
a third NVDRAM cell, comprising:
   a third DRAM cell, coupled to the first bit line, comprising:
      a third capacitor having a first terminal coupled to a third storage node and a second terminal coupled to the reference; and
      a third transfer transistor having a first current electrode coupled to the first power supply terminal, a second current electrode coupled to the third storage node, and a control electrode;
   a third pass gate transistor coupled between the first bit line and the third storage node;
   a fifth non-volatile element having a first terminal coupled to the control electrode of the third transfer transistor and a second terminal coupled to the first non-volatile line;
   a sixth non-volatile element having a first terminal coupled to the control electrode of the third transfer transistor and a second terminal;
   a third switching transistor having a first current electrode for receiving the first program signal, a second current electrode coupled to the control electrode of the third transfer transistor, and a control electrode coupled to the second select line; and
   a fourth switching transistor having a first current electrode coupled to the second terminal of the fourth non-volatile element, a second current electrode coupled to the fourth non-volatile line, and a control electrode coupled to the second select line.

9. The NVDRAM of claim 8, wherein the NVDRAM further comprises a first word line and a second word line, wherein the first pass gate transistor has a control electrode coupled to the first word line, the second pass gate transistor has a control electrode coupled to the first word line, and the third pass gate transistor has a control electrode coupled to the second word line.

10. The NVDRAM of claim 9, further comprising:
a first decoder coupled to the first bit line, the second bit line, the first non-volatile line, the second non-volatile line, the third non-volatile line, and a fourth non-volatile line.

11. The NVDRAM of claim 10, further comprising a multiplexer coupled to the first decoder for providing output data.

12. The NVDRAM of claim 11, further comprising a row decoder coupled to the first word line, the second word line, the first select line, and the second select line.

13. A method of operating a non-volatile dynamic random access memory (NVDRAM) cell having a first non-volatile element having a first terminal coupled to a first terminal of a second non-volatile element at a transfer node, the first and second non-volatile elements having second terminals, comprising:

programming the first non-volatile element and the second non-volatile element by applying a voltage differential to the second terminals of the first and second non-volatile elements while providing an alternated voltage at the transfer node to result in a logic state represented by a resistance differential between the first non-volatile element and the second non-volatile element;
transferring the logic state to a storage node through a transfer transistor coupled to the transfer node and the storage node: and
reading the logic state by coupling the storage node to a bit line through a pass gate transistor.

14. The method of claim 13, wherein the programming is further characterized by the voltage differential being applied across a first non-volatile line and a second non-volatile line, the second terminal of the first non-volatile element being coupled to the first non-volatile line, and the second terminal of the second non-volatile element being coupled to the second non-volatile line and the alternated voltage being applied to the to the transfer node in response to a program signal being enabled.

15. The method of claim 14, wherein the transferring is further characterized by applying a restore signal across the first non-volatile line and the second non-volatile line while coupling the second terminal of the second non-volatile element to the second non-volatile line.

16. The method of claim 15, wherein the transferring is further characterized by a control electrode of the transfer transistor being coupled to the transfer node.

17. The method of claim 14, wherein during the transferring, the alternated voltage applied during the programming is replaced with floating.

18. A non-volatile dynamic random access memory (NVDRAM), comprising:
   a first non-volatile element having a first terminal coupled to a first terminal of a second non-volatile element at a transfer node, the first and second non-volatile elements having second terminals;
   a DRAM cell having a transfer transistor and a storage node, wherein the transfer transistor is coupled to the storage node and the transfer node;
   a first non-volatile line coupled to the second terminal of the first non-volatile element and a second non-volatile line; and
   circuitry that, during a program mode, applies an alternated signal to the transfer node, couples the second terminal of the second non-volatile element to the second non-volatile line, and applies a program signal across the first and second non-volatile lines and that, during a restore mode, applies a read signal across the first and second non-volatile lines, couples the second terminal of the second non-volatile element to the second non-volatile line, and replaces the alternated signal with floating, in which a logic state represented the first and second non-volatile elements that have been programmed is loaded from the transfer node to the storage node.

19. The NVDRAM of claim 18, further comprising a pass gate coupled between a bit line and the storage node that is used to couple the bit line to the storage node that enables reading the logic state.

* * * * *